US005701324A

United States Patent [19]

Abram

[11] Patent Number: 5,701,324
[45] Date of Patent: Dec. 23, 1997

[54] OPTICAL, OPTO-ELECTRONIC OR PHOTONIC COMPONENT INCLUDING AT LEAST ONE LATERALLY CONFINED OPTICAL CAVITY

[75] Inventor: Izo Abram, Saint-Cloud, France

[73] Assignee: France Telecom, France

[21] Appl. No.: 517,558

[22] Filed: Aug. 21, 1995

[30] Foreign Application Priority Data

Aug. 23, 1994 [FR] France ................... 94 10216

[51] Int. Cl.⁶ ................................................. H01S 3/18
[52] U.S. Cl. ..................................... 372/92; 372/96
[58] Field of Search ........................... 372/96, 92

[56] References Cited

U.S. PATENT DOCUMENTS

| 4,991,179 | 2/1991 | Deppe et al. | 372/92 |
|---|---|---|---|
| 5,115,442 | 5/1992 | Lee et al. | 372/96 |
| 5,164,949 | 11/1992 | Ackley et al. | 372/96 |
| 5,351,257 | 9/1994 | Lebby et al. | 372/96 |
| 5,432,812 | 7/1995 | Kurobe et al. | 372/96 |

FOREIGN PATENT DOCUMENTS

| 0 562 769 | 3/1993 | European Pat. Off. | H01S 3/85 |
|---|---|---|---|
| 3-205888 | 9/1991 | Japan | 372/96 |
| 4-26178 | 1/1992 | Japan | 372/96 |
| 4-42589 | 2/1992 | Japan | 372/96 |
| 6-252504 | 9/1994 | Japan | 372/96 |

OTHER PUBLICATIONS

IEEE Photonics Technology Letters, vol. 5, No. 3, Mars 1993, New York, pp. 284–287.
Superlattices and Microstructures, vol. 12, No. 1, Jan. 1992, London, pp. 89–92.
Applied Physics Letters, vol. 62, No. 20, 17 May 1993, New York, pp. 2489–2491.
Physics Today, Jun. 1993, New York, pp. 66–73.
Optics & Photonics News, Aug. 1992, pp. 10–14.
Applied Physics Letters, vol. 60, No. 5, Feb. 3, 1992, pp. 607–609.
Optical and Quantum Electronics, vol. 24, 1992, pp. 245–272 (No month avail).
Optical Society Of America, vol. 10, No. 2, Feb. 1993, pp. 360–380.
Applied Physics Letters, vol. 64, No. 7, 14 Feb. 1994, New York, pp. 869–871.

*Primary Examiner*—Rodney B. Bovernick
*Assistant Examiner*—Yisun Song
*Attorney, Agent, or Firm*—Blakely Sokoloff Tayor & Zafman

[57] ABSTRACT

Optical, opto-electronic or photonic component comprising, for a given operating wavelength, at least one optical cavity defined between two reflectors and confined laterally. The reflectors are of the phase change type and the area between the reflectors that corresponds to the optical cavity has a cut-off wavelength greater than the cut-off wavelength of the area surrounding it laterally, the operating wavelength lying between the two cut-off wavelengths. The method enables manufacture of a component of this kind using relatively shallow etching.

2 Claims, 2 Drawing Sheets

OPTICAL, OPTO-ELECTRONIC OR PHOTONIC COMPONENT INCLUDING AT LEAST ONE LATERALLY CONFINED OPTICAL CAVITY

BACKGROUND OF THE INVENTION

1. Field of the Invention

The present invention concerns optical, opto-electronic and photonic components including at least one laterally confined optical cavity. It also concerns a method of manufacturing a component of this kind.

The confined optical cavities of components in accordance with the invention are used to form lasers, photodetectors, or optical memory, switching or logic elements therein.

Consequently, an advantageous application of the invention is to signal processing, detection and transmission in optical telecommunications.

2. Description of the Prior Art

Various optical and opto-electronic components require an optical cavity usually constituted by two parallel plane reflective surfaces. This geometrical configuration reinforces the luminous field inside the cavity because of its unidimensional confinement between the two reflective surfaces. The optical cavity is indispensible in the case of optical bistables and lasers, for example, while other components that can operate without any such cavity offer improved performance if they are placed within an optical cavity. This applies to photodetectors, for example.

Representative examples of opto-electronic components utilizing an optical cavity are vertical cavity surface emitting lasers (VCSEL) which are currently available off the shelf. These components comprise three stacked groups of thin semiconductor layers deposited by the usual crystalline growth methods onto a semiconductor substrate. The first group of layers deposited onto the substrate constitutes a Bragg reflector, the second forms the laser cavity and the third constitutes the top Bragg reflector of the cavity. Light is emitted and amplified by active layers in the second group that are excited electrically or optically and leaves the cavity perpendicularly to its plane through the top Bragg reflector.

It is often necessary to restrict the lateral size of optical cavity components with a view to miniaturization and integration of a large number of components on the same substrate. For example, individual components with lateral dimensions in the order of a few tens of microns can constitute a matrix of "pixels" (picture elements), i.e. juxtaposed individual elements that operate in conjunction to display or process images. Lateral delimitation of a cavity on a smaller scale can reinforce the luminous field at the active element of the component by additionally imposing optical confinement in the plane of the cavity. In particular, lateral delimitation to dimensions in the order of a few optical wavelengths eliminates higher order transverse modes of the optical cavity, the presence of which could compromise the operation of some components. Finally, lateral dimensions in the order of one optical wavelength eliminate all higher order transverse modes and cause monomode operation of the cavity, the result of which is laser emission at a single frequency, for example.

In the remainder of this document the terms "optical resonator" and "optical microresonator" refer to a single-frequency monomode optical cavity of this kind.

Lateral delimitation of semiconductor optical resonators is routinely effected by a method using the laser etching techniques developed for electronic components. In this method, when the planar cavity has been fabricated by depositing the three groups of thin semiconductor layers, it is covered by a mask that protects the parts to constitute the component. The unprotected parts are then etched chemically or by reactive ion etching and therefore eliminated. When the mask is removed the component remains in the form of a mesa with relatively steep sides through all three groups of layers.

A second method of optical lateral delimitation is the method known as alloy mixing. In this method, after deposition of the mask, crystalline defects are introduced into the exposed parts of the sample by ionic bombardment or by stresses caused by a deposit of silica and the material is then annealed. The crystalline defects destroy the multilayer structure of the sample, producing an alloy of the various semiconductors that constitute the original layers. The stratified intact parts constituting the component are delimited by the interface between them and the "external" disordered parts.

The lateral delimitation methods used at present to define opto-electronic components suffer from various technical problems which make them complicated to use and make it impossible to achieve the ultimate miniaturization in the optical domain, i.e. dimensions in the order of one wavelength.

The main drawbacks of cavity components defined by mesa etching or by alloy mixing are as follows:

(1) From the optical point of view:

The optical confinement is relatively weak, since it is produced by reflection of light at the interface between the parts protected by the mask and the parts treated. The reflection is caused by the difference between the indices of refraction of the two regions and is consequently relatively weak. For etched semiconductor mesas in air, the index contrast is in the order of 3, which corresponds to a reflectivity of only around 25% for plane surfaces. In the case of alloy mixing, the index contrast is a few percent (because the materials on opposite sides of the interface are essentially the same), producing a reflectivity that is usually below 1%.

(2) From the electronic point of view:

The deep lateral structure reaches the semiconductor layers that are active in the emission of light and degrade their electronic properties associated with light emission. In particular, the etching operation produces non-radiative recombination centers near the interfaces, which reduces the quantum efficiency of emission, especially in the case of small mesas. In some cases, the defects can be cured by appropriate passivation and crystal regrowth, but the use of such operations considerably complicates the lateral structuring process.

(3) From the mechanical and geometrical points of view:

Semiconductor mesas etched to a depth of a few micrometers with lateral dimensions in the order of a fraction of a micrometer are mechanically very fragile, because of their high aspect ratio (depth/width). What is more, the degree of verticality of the sides needed for an aspect ratio of this magnitude is very difficult to achieve by etching. These mechanical and geometrical problems are such that the method of lateral delimitation of planar semiconductor cavities by etching mesas through the three groups of layers cannot produce cavities with lateral dimensions in the order of one wavelength.

An object of the invention is to solve these problems.

To this end, the invention proposes to use the properties of optical cavities defined by two reflectors which, on reflection, produce a change of phase of π radians in the reflected field. These reflectors are metal reflectors or Bragg reflectors having a refractive index higher than that in the cavity, for example.

A specific feature of cavities formed by phase change reflectors is the existence of an optical cut-off wavelength equal to twice the optical thickness of the cavity (the optical thickness being defined as the product of the physical thickness by the refractive index). Wavelengths greater than the cut-off wavelength constitute the "forbidden band" of the cavity. The cavity cannot support light at a wavelength greater than the cut-off wavelength: such light is completely reflected outside the cavity and evanescent inside it.

The person skilled in the art is aware of these inhibiting phenomena which have been reported in the literature. Reference may usefully be made to the following articles:

"Cavity quantum electrodynamics at optical frequencies" S. E. Morin, Q. WU, T. W. Mossberg—Optics and Photonics News—August 1992—p10–14 and in particular p11;

"Spontaneous and stimulated emission in the thresholdless microlaser"—F. de Martini, M. Marrocco, P. Mataloni, D. Murra, R. Loudon—J. Opt. Soc. Am. B-Vol 10, No 2—February 1993 p360–380.

SUMMARY OF THE INVENTION

The invention consists in an optical, opto-electronic or photonic component comprising, for a given operating wavelength, at least one optical cavity defined between two reflectors and confined laterally, wherein said reflectors are of the phase change type and the area between said reflectors that corresponds to said optical cavity has a cut-off wavelength greater than the cut-off wavelength of the area surrounding it laterally, said operating wavelength lying between said two cut-off wavelengths.

As will emerge later, in the detailed description of the invention, the lateral optical confinement of the cavity of a component of the above kind is 100% and therefore much enhanced compared to the confinement achieved in the prior art.

Furthermore, a structure of this kind is particularly suitable for ultimate miniaturization and in particular the manufacture of optical resonators having dimensions in the order of one wavelength.

A resonator of this kind exhibits high optical confinement in three directions on a scale in the order of the optical wavelength, so modifying the spontaneous emission by the active layers. In has an advantageous application in the manufacture of single-frequency semiconductor lasers with a very low threshold and a high efficiency.

In one particularly advantageous embodiment the area between the two reflectors that corresponds to the optical cavity and the area surrounding it laterally are made in the same material, the thickness of the area that corresponds to the optical cavity being greater than that of the area surrounding it laterally.

The invention further consists in a method of manufacturing a component of this kind comprising the following steps:

depositing a layer of cavity forming material onto a first reflector, depositing a mask onto said layer or onto a layer encapsulating it, bombarding said mask and unprotected areas of said layer or said encapsulating layer with active ions to etch said unprotected areas shallowly, removing said mask, depositing the second reflector.

Since the etch is not deep, it does not reach the active layer of the cavity and consequently does not degrade its electrical and optical characteristics.

The following description of the invention is given by way of illustrative and non-limiting example only and with reference to the appended drawings.

DETAILED DESCRIPTION OF THE PREFERRED EMBODIMENTS

Figure 1:
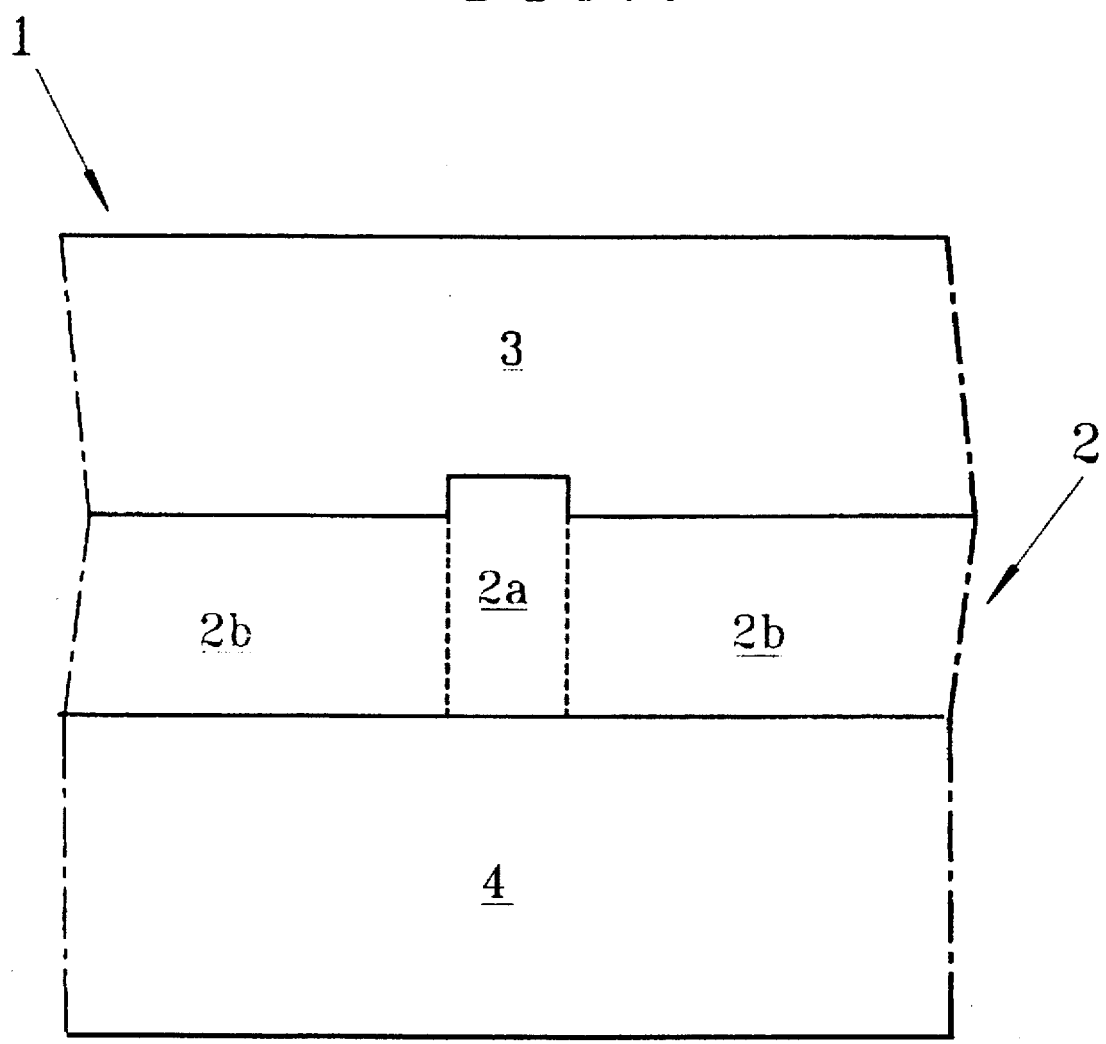
FIG. 1 is a diagrammatic sectional view of a component in accordance with the invention.

FIG. 1 is a diagrammatic representation of one specific embodiment of a component 1 in accordance with the invention. The component 1 is a wafer comprising three stacked groups of thin layers (semiconductor, dielectric or metallic layers) constituting a plane cavity 2 between two phase change reflectors 3 and 4.

The plane cavity 2 comprises at least two parts:

a central part 2a that has a cut-off wavelength $\lambda_{c1}$;

another part 2b surrounding the central part 2a laterally in all directions of the plane cavity 2 and having a cut-off wavelength $\lambda_{c2}$ slightly less than $\lambda_{c1}$ ($\lambda_{c2}<\lambda_{c1}$).

In a wafer 1 of this kind, the short wavelength lateral part 2b cannot support light at a wavelength λ between the cut-off wavelengths ($\lambda_{c2}<\lambda<\lambda_{c1}$) and this light is reflected towards the high cut-off wavelength part 2a.

In other words, light emitted at wavelength λ ($\lambda_{c2}<\lambda<\lambda_{c1}$) in component 1 is in the forbidden band of the lateral part 2b and is therefore necessarily confined in the central part 2a by total reflection in all directions.

The resulting confinement is free of energy losses: the lateral part 2b which delimits the confinement does not absorb and does not transmit the light it receives. All of the light energy is kept within the central part 2a.

100% optical confinement is thereby achieved which is very much enhanced compared to the optical confinement achieved with prior art techniques.

The cut-off wavelength of the lateral part 2b is reduced relative to that of the central part 2a by locally reducing by a few layers the optical thickness of the cavity 2, either by modifying the refractive index in this part 2b or (and preferably—see FIG. 1) by reducing the physical thickness of the group of layers constituting the cavity 2 in the part 2b.

The local reduction in the physical thickness of the cavity 2 is advantageously effected by component etching techniques that are familiar to the person skilled in the art, for example methods similar to that described in the article:

"Reduced threshold all-optical bistability in etched quantum well microresonators"—T. Rivera, F. R. Ladan, A. Izraël, R. Azoulay, R. Kuszelewicz and J. L. Oudar—Appl. Phys. Lett.—64(7) February 1994—p869–871.

The etch is not deep and therefore does not reach (and consequently does not damage) the light emitting active layer although it keeps an etch aspect ratio (depth/width) usually less than 1. This low aspect ratio achieves good geometrical definition and good mechanical stability even of components with dimensions less than one wavelength.

The invention can produce components 1 having optical cavities 2a with dimensions less than the wavelength and therefore makes it possible to manufacture essentially monomode optical microresonators with high luminous field confinement.

The production of monomode resonators has major advantages in the production of opto-electronic components and in particular in the production of laser microcomponents.

Reference may usefully be made to the publication:

"Optical processes in microcavities"—Y. Yamamoto, R. E. Slusher—Physics today—June 1993—American Institute of Physics—p66–73, the contents of which are hereby incorporated by reference.

In particular, the high frequency selectivity of these resonators can be used to make single-frequency lasers.

The high confinement of the field within a microresonator of this kind modifies the spontaneous emission properties of the active layers so that the laser emission threshold can be very significantly lowered.

What is more, the size of these microresonators, being comparable to the optical wavelength, represents the ultimate miniaturization of opto-electronic components compatible with the laws of diffraction of light.

Furthermore, the method of manufacture proposed by the invention lends itself equally well to the production of matrices of such resonators for use in parallel processing and integration of a plurality of unit components on the same substrate, indicating the possibility of manufacturing integrated opto-electronic components of minimal size (the limiting dimensions being imposed by the laws of diffraction of light).

More generally, the inclusion in microresonators proposed by the invention of materials having adequate optical or opto-electronic properties enables the production of specific components and in particular, in addition to microlasers, photodetector components and optical logic, switching and memory elements.

One example of a component made from two semiconductor materials commonly used to manufacture electronic and opto-electronic components, namely GaAs and AlAs, will now be described in detail.

Of course, other materials are feasible. In particular, the use of pairs of materials having a higher refractive index contrast or metallic layers to constitute the reflectors would improve the confinement of the luminous field perpendicularly to the plane of the layers.

A stratified structure made up of alternate layers of GaAs and AlAs is made first by the usual methods for crystal growth of these materials onto GaAs substrates, i.e. molecular beam epitaxy or metal-organic chemical vapor deposition.

This structure comprises two groups of layers:

the first group is a stack of 20 alternating layers of AlAs and GaAs respectively 81.1 nm and 67.8 nm thick, corresponding to a Bragg reflector the reflectivity band of which is centered on the wavelength of 960 nm;

the second group comprises a layer of $Al_{0.9}Ga_{0.1}As$ (optionally comprising a central quantum well of $In_{0.15}Ga_{0.85}As$) 190 nm thick (corresponding to a $\lambda/2$ half-wave cavity at 986 nm) and a 20 nm thick layer to temporarily encapsulate the layer constituting the cavity.

A mask is then deposited onto the second group of layers. This mask delimits disks 320 nm in diameter optionally arranged in a matrix of M by N units.

The mask and the non-covered areas of the second layer are bombarded with reactive ions to etch said areas not protected by said mask to a depth of 80 nm to reduce the thickness of the layer constituting the cavity to 130 nm in these areas.

When the mask has been removed, the sample can be returned to the epitaxy apparatus for crystalline regrowth (after first removing the encapsulation layer) to deposit a third group of layers comprising 13 alternating GaAs and AlAs pairs corresponding to the top reflector of the cavity.

This latter stage can equally well be replaced or complemented by depositing one or more metallic layers. Metallic reflectors have a great advantage in electrically excited components as they are conductive and can therefore constitute one of the excitation electrodes. Because of the low penetration of the field in such reflectors, confinement of the field in the cavity is enhanced and, consequently, a less deep etch can produce the same change in the cut-off wavelength as multilayer reflectors.

Figure 2:
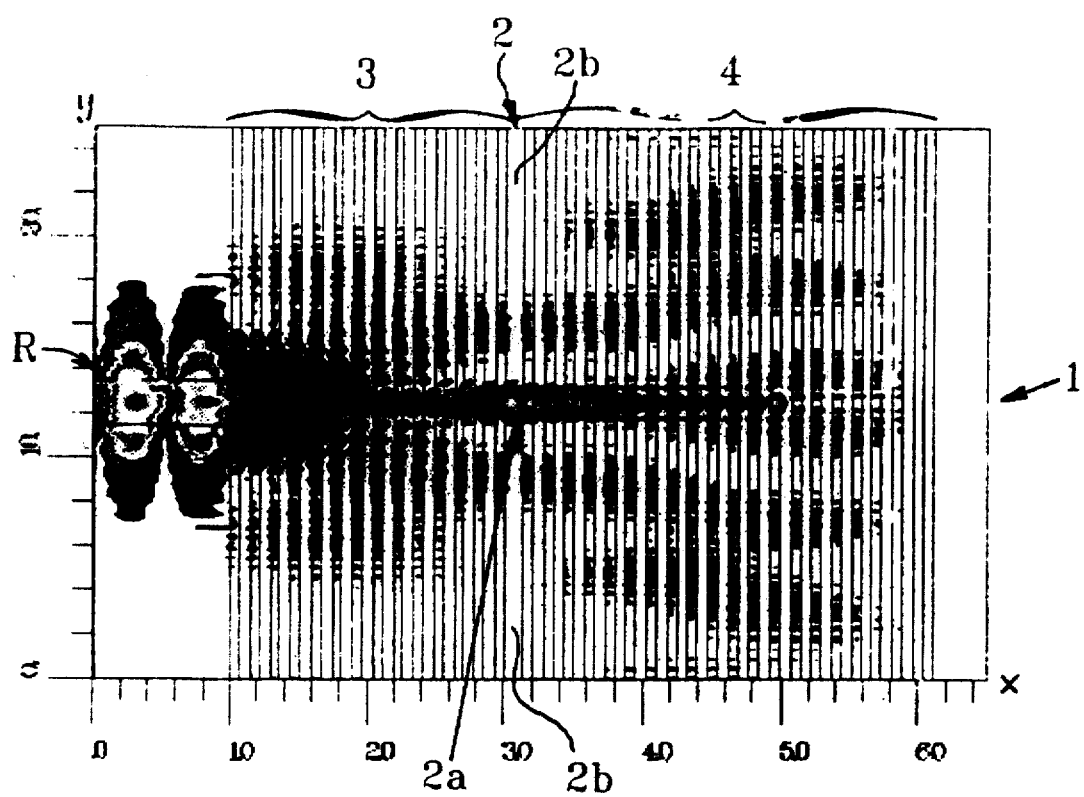
FIG. 2 is a diagrammatic sectional view of the stacked structure of a component of the invention, also showing the distribution within the structure of the intensity of light at a wavelength corresponding to the discrete mode of the resonator of said component.

FIG. 2 is a diagrammatic sectional view of a microresonator produced by the method just described. FIG. 2 uses the same reference numbers as FIG. 1.

With the numerical values indicated, this microresonator has a 960 nm wavelength discrete mode clearly separated from the continuum that starts at 935 nm.

As shown by the distribution of the same intensity areas represented in FIG. 2, radiation R corresponding to the aforementioned discrete mode and impinging on the component 1 perpendicular to the planes of its layers is laterally confined in the plane of the cavity 2, in the central part 2a: it is localized under the disk defined by the etch (part 2a) and is evanescent in the treated part (part 2b) into which it penetrates only 300 nm.

The field is confined in the axial direction of the cavity by reflection at the two Bragg reflectors 3 and 4; the field is therefore maximal at the AlAs layer ("$\lambda/2$") and decreases in the Bragg reflectors over a distance in the order of 300 nm. Light is emitted to the exterior of the cavity through the Bragg reflectors 3 and 4.

Figure 3:
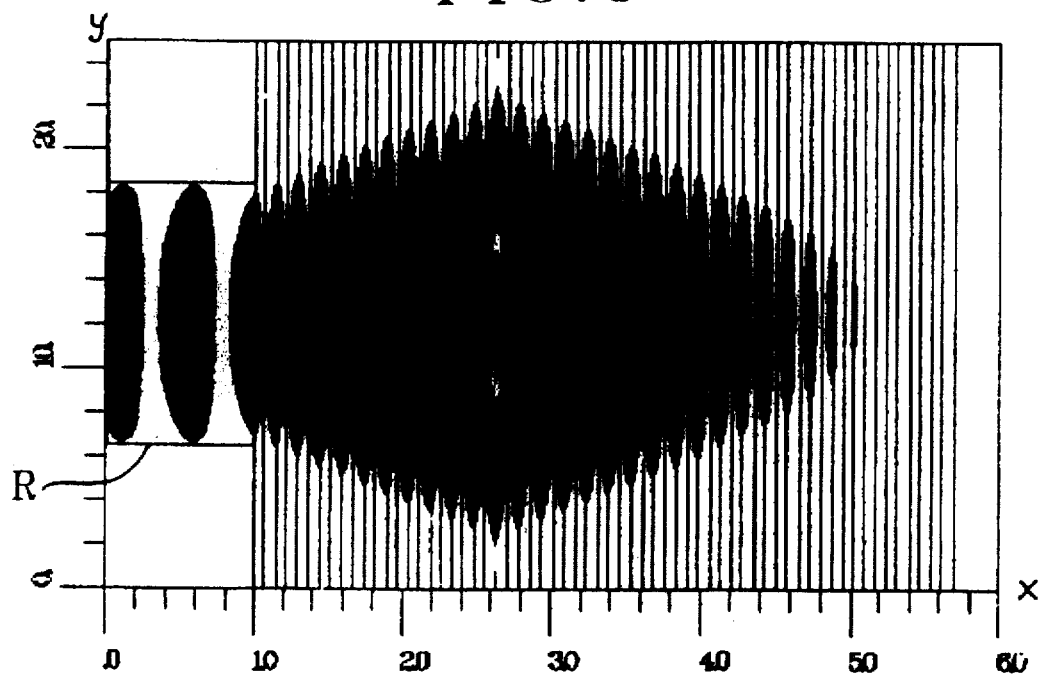
FIG. 3 is a representation similar to FIG. 2 of a component consisting of a stack of the same materials as the FIG. 2 component but with no confinement.

The distribution of the luminous intensity shown in FIG. 2 should be compared with that shown in FIG. 3. The corresponding radiation R' is similar to that of FIG. 2. The component on which it impinges is a stack of the materials of the FIG. 2 component but with no confinement.

FIG. 3 shows that the width of the area in which the radiation R' is distributed is determined primarily by the geometry of the incident beam.

There is claimed:

1. Optical, opto-electronic or photonic component, for a given operating wavelength, comprising at least one first optical cavity area disposed between two phase change type reflectors and confined laterally, by a second optical cavity area wherein said second optical cavity area is disposed between said reflectors; said first optical cavity area has a cut-off wavelength greater than a cut-off wavelength of said second optical cavity area, said operating wavelength lying between the cut-off wavelength of the first optical cavity area and the cut-off wavelength of the second optical cavity area, wherein the optical thickness of said area between said two reflectors that corresponds to said optical cavity is greater than that of said area that surrounds it laterally;

wherein said area between said two reflectors that corresponds to said optical cavity and said area that surrounds it laterally are made from the same material, the thickness of said area that corresponds to said optical cavity being greater than that of said area that surrounds it laterally.

2. Optical, opto-electronic or photonic component, for a given operating wavelength, comprising at least one first optical cavity area disposed between two phase change type reflectors and confined laterally, by a second optical cavity area wherein said second optical cavity area is disposed between said reflectors; said first optical cavity area has a cut-off wavelength greater than a cut-off wavelength of said second optical cavity area, said operating wavelength lying between the cut-off wavelength of the first optical cavity area and the cut-off wavelength of the second optical cavity area, wherein said area between said two reflectors that corresponds to said optical cavity has lateral dimensions less than said operating wavelength, said cavity being a monomode cavity.

* * * * *